United States Patent [19]
Lindner

[11] Patent Number: 4,737,388
[45] Date of Patent: Apr. 12, 1988

[54] NON-IRIDESCENT, HAZE-FREE INFRARED REFLECTING COATED GLASS STRUCTURES

[75] Inventor: Georg H. Lindner, Vlissingen, Netherlands

[73] Assignee: M&T Chemicals Inc., Woodbridge, N.J.

[21] Appl. No.: 802,551

[22] Filed: Nov. 27, 1985

Related U.S. Application Data

[63] Continuation-in-part of Ser. No. 733,997, May 14, 1985, Pat. No. 4,600,654.

[51] Int. Cl.$^4$ .............................................. E06B 3/26
[52] U.S. Cl. ................... 428/34; 427/126.2; 427/126.3; 427/166; 427/209
[58] Field of Search ............... 428/34, 432; 427/166, 427/126.2, 126.3, 209

[56] References Cited

U.S. PATENT DOCUMENTS

| | | | |
|---|---|---|---|
| 3,420,693 | 1/1969 | Scholes | 427/226 |
| 4,069,630 | 1/1978 | Chess et al. | 428/34 X |
| 4,187,336 | 2/1980 | Gordon | 428/34 |
| 4,308,316 | 12/1981 | Gordon | 428/34 X |
| 4,568,578 | 2/1986 | Arfsten et al. | 428/34 |
| 4,584,206 | 4/1986 | Sleighter | 427/109 |

Primary Examiner—Janyce A. Bell
Attorney, Agent, or Firm—S. H. Parker; R. E. Bright

[57] ABSTRACT

Transparent, non-iridescent, infrared-reflecting glass window structures which are haze-free are provided herein. These structures comprise a glass sheet, an infrared-reflecting tin oxide coating on one major surface of the sheet, and an iridescence-reducing tin oxide coating on the opposed major surface of the sheet. The iridescence-reducing tin oxide coating is particularly characterized by being haze-free by virtue of its being made by contacting said sheet with monophenyltin trichloride in an oxygen-containing atmosphere.

4 Claims, 1 Drawing Sheet

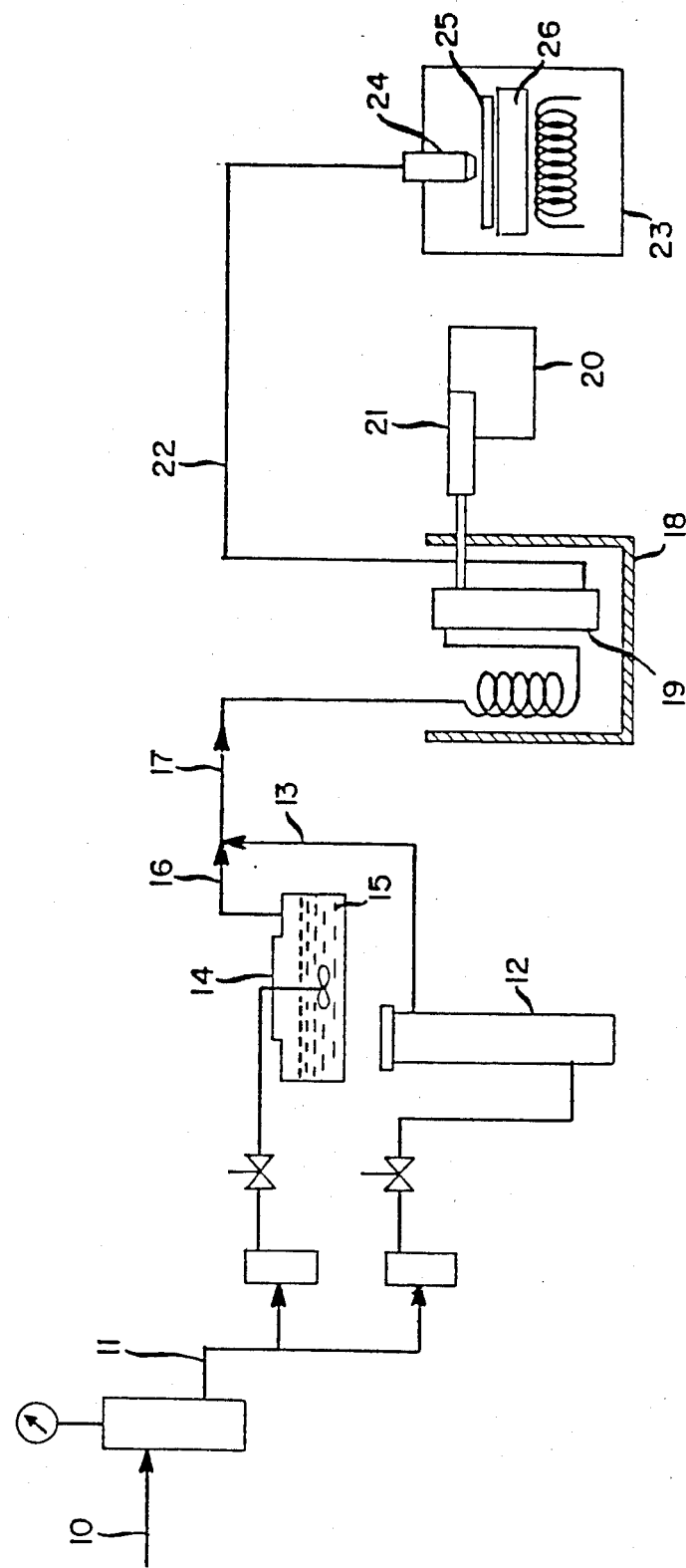

NON-IRIDESCENT, HAZE-FREE INFRARED REFLECTING COATED GLASS STRUCTURES

CROSS-REFERENCES TO RELATED APPLICATIONS

This application is a continuation-in-part of copending U.S. Ser. No. 733,997, filed May 14, 1985, now U.S. Pat. No. 4,600,654 by the same inventor as herein.

BACKGROUND OF THE INVENTION

1. Field of the Invention

This invention relates to glass structures having an infrared reflective coating of conductive tin oxide thereon, and, more particularly, to non-iridescent, transparent, haze-free, low emissivity, infrared-reflecting, energy efficient glass window structures which are provided with an iridescent-masking coating of tin oxide which is transparent and haze-free.

2. Description of the Prior Art

The art recognizes that glass and other transparent materials can be coated with transparent conductive tin oxide films in order to reflect infrared radiation. Such structures are useful in providing windows with enhanced insulating value, i.e. lower heat transport.

Tin oxide films are especially effective infrared reflectors at thicknesses of about 1000 to 8000 Angstroms. However, at such thicknesses the films tend to display interference effects, i.e., multiple visible colors, commonly referred to as iridescence. These interference effects render the coated glass aesthetically unacceptable for most architectural applications. Iridescence is not observed in thinner films; however, these films have insufficient infrared reflectance to be of practical utility. Likewise, iridescence is not observed in thicker films but such films tend to be hazy, and absorb considerable light and are difficult to make uniformly. Therefore, various methods to mask interference effects have been developed.

Particularly, the objectionable interference colors (iridescence) in reflected light has been diminished by the structures provided by Gordon, in U.S. Pat. Nos. 4,187,336; 4,206,252; 4,308,316 and 4,377,613; and by Michelotti and Henery in EPO No. 0137,161, published Apr. 17, 1985. These infrared reflecting coated glass structures include means designed to diminish the iridescence effect. However, while these coatings function effectively for the purpose of reducing iridescene, they introduce haze into the system unless formed under very restrictive and disadvantageous deposition conditions. Gordon, for example, states that haze, which ordinarily would appear in the tin oxide coating, can be reduced by first depositing on the window glass an amorphous layer of $SiO_2$, $Si_3N_4$, $GeO_2$, $Al_2O_3$, or silicon oxy-nitride, or mixtures thereof with each other, or with other metal oxides. However, Gordon cautions that if this layer contains a large proportion of the metal oxides, $Ga_2O_3$, ZnO, $In_2O_3$, or $SnO_2$, then haze formation is likely.

In the art, it is recognized that the appearance of haze in tin oxide coatings formed on glass by exposure to tin compounds can be prevented or reduced by application of an intervening coating of suitably selected composition. For example, U.S. Pat. No. 2,617,741 proposes to provide a protective layer preceding the formation of the tin oxide coating by spraying the heated glass with a saturated or relatively concentrated aqueous solution of a suitable soluble metal salt, particularly the acetates of copper, aluminum, lead, zinc, iron, nickel, cobalt, thallium, silver or titanium.

Similarly, Terneu in U.S. Pat. No. 4,329,379, describes an undercoat of a metal oxide formed by decomposition of the acetylacetonate of titanium, nickel or zinc on which a tin oxide overcoat free from perceptible haze can be formed.

Two-layered, haze-free glass structures also are described in U.S. Pat. Nos. 4,547,400 and 4,548,836. The patents state that the undercoat should be made from a chlorine-free organotin compound, particularly dibutyltin diacetate.

Accordingly, it is an object of this invention to provide transparent, non-iridescent, haze-free, energy efficient glass structures which includes a first conductive tin oxide coating which reflects infrared radiation, and a second, haze-free tin oxide coating, which reduces iridescence in said structure.

Another object of the invention is to provide such transparent, non-iridescent, haze-free energy efficient glass structures having a plurality of tin oxide coatings including a transparent, conductive tin oxide coating which reflects infrared radiation and a haze-free tin oxide coating which reduces iridescence, made by chemical vapor deposition of monophenyltin trichloride.

Still another object herein is to provide transparent, non-iridescent, haze-free, infrared reflecting glass window structures which includes a transparent, haze-free tin oxide coating made from monophenyltin trichloride on one surface of a glass sheet and a second, transparent, conductive tin oxide coating on the opposite surface of said sheet, in predetermined thicknesses relative to each other to substantially reduce iridescence in said structure.

A further object of this invention is to provide a non-iridescent, haze-free tin oxide coating energy efficient, glass window structure capable of reflecting infrared energy which includes a transparent, haze-free tin oxide coating composed of two layers including an undercoat layer close to the glass made by depositing monophenyltin trichloride in air, and an overcoat layer of tin oxide which assumes the haze-free characteristics of the undercoat layer.

Among the other objects of the invention is to provide an energy efficient, double-glazed glass window structure which is non-iridescent, and in which the haze-free tin oxide coating which is present for the purpose of reducing iridescence is made by chemical vapor deposition of monophenyltin trichloride.

BRIEF DESCRIPTION OF THE DRAWINGS

In order to better understand the invention, reference will be made to the accompanying drawings in which:

The FIGURE is a schematic diagram of a suitable coating, apparatus for making an iridescence reducing tin oxide coating according to the invention.

SUMMARY OF THE INVENTION

There are provided herein non-iridescent, haze-free, infrared reflecting glass structures including a transparent, conductive tin oxide coating which reflects infrared radiation, and a transparent, haze-free tin oxide coating made from monophenyltin trichloride, which is present to reduce iridescence in said structure. Such tin oxide coatings are also referred to herein as interference masking films.

In an embodiment of the invention, the coatings are applied on opposed surfaces of a glass sheet and the thickness of the haze-free tin oxide coating made from monophenyltin trichloride is predetermined in relation to the thickness of the conductive tin oxide coating, to provide a substantially non-iridescent, haze-free structure.

The haze-free tin oxide coating made from monophenyltin trichloride can be applied as a single layer or it can form an undercoat for subsequent layers thereon which assume the haze-free characteristics of the undercoat. The conductive tin oxide coating is formed by conventional methods, e.g. pyrolysis, chemical vapor deposition, powder coating, and cathode sputtering, and from conventional sources of doped tin oxide, e.g. dibutyltin difluoride, dibutyltin diacetate, monobutyltin trichloride, etc. and, where necessary, a dopant, such as a fluorine dopant.

A double-glazed glass window article which is transparent and haze-free also is provided herein.

DETAILED DESCRIPTION OF THE INVENTION

Interference masking (iridescence reducing) films effective in accordance with the present invention are tin oxide films made from monophenyltin trichloride. Such interference masking films are colorless tin oxide films with a visible reflectance high enough to mask the visible interference effect of the tin oxide infrared reflecting film. The thickness of the tin oxide masking film is selected in accordance with the criterion established in the aforementioned Gordon and Michelotti patents to provide the desired iridescence reduction effect.

In one embodiment of these structures, an infrared reflecting coating is applied to one surface of a glass sheet and a more visible reflective masking film is deposited on the opposite surface of the glass sheet. This coated product may be used monolithically or preferably may be mounted in a multiple glazed unit.

In another embodiment, an infrared reflecting film is applied to surface of a glass sheet, while a more visibly reflective masking film applied to one surface of a second glass sheet. The two coated glass sheets are assembled into a multiple glazed window unit, preferably with both coatings facing the interior space in the unit. The preferred orientation for the multiple glazed unit in a building is with the infrared reflective film on the interior glass sheet.

In still another embodiment of the present invention, both sheets of a double glazed unit are coated on both sides, with tin oxide infrared reflecting films on the interior surfaces and colorless tin oxide masking films on the exterior surfaces. The two coatings may be applied simultaneously.

In another embodiment of a double-glazed window structure, the interior surface of one glazing is infrared-reflecting, and the interior surface of the other glazing, facing each other, is inridescent-reducing made from monophenyltin trichloride.

Such articles are effective for passive solar heating applications because the high transmittance allows solar energy (light and heat) into a structure, while the high infrared reflectance and low emissivity keep heat inside the structure from being lost.

Referring now to the FIGURE, there is shown a diagramatic representation of an apparatus suitable for making the interference masking film in the present invention. Accordingly, a carrier gas 10, which includes oxygen, is metered through a feed line 11 at a predetermined flow rate through an air dryer tower 12 to provide a stream 13 of dry air. A separate air stream may be directed through a humidifier 14 containing a suitable quantity of water 15 to provide a wet air stream 16 at a desired relative humidity. Thereby an air stream 17, either dry or wet, may be passed through an evaporator 18 containing vessel 19 for holding liquid monophenyltin trichloride. The liquid is supplied to evaporator 18 by syringe pump 20 and syringe 21. The air stream is heated from an oil bath (not shown) to a desired vaporization temperature.

The vaporized liquid monophenyltin trichloride in the air stream 22 travels to a deposition chamber 23 having a coating nozzle 24 in which a glass substrate 25 is mounted on a plate 26 heated to a predetermined temperature. After deposition of the haze-free, masking tin oxide coating on the glass substrate, the gaseous by-products of the deposition are exhausted.

To prepare the tin oxide coating from monophenyltin trichloride, the glass substrate suitably is held at a temperature of about 450° to 650° C., preferably 500° to 600° C.

The vaporization temperature of liquid monophenyltin trichloride in the process suitably ranges from about 100° to 400° C., preferably about 120° to 175° C.

The carrier gas is an oxygen-containing gas which suitably may be air, or a mixture of oxygen and an inert gas, and is preferably air.

The carrier gas may be dry or wet; preferably the water vapor concentration is less than 10 moles of water per mole of monophenyltin trichloride.

The carrier gas velocity suitably ranges from about 0.1 to about 10 m per sec.

The concentration of monophenyltin trichloride in the carrier gas suitably ranges from about $10^{-5}$ to $10^{-2}$ moles of monophenyltin trichloride per mole of carrier gas.

In general, this process produces a haze-free tin oxide coating which has less than 1% haze, and greater than 80% visible transmission, and is obtained in a desired thickness within a rapid deposition time.

Alternatively, a haze-free tin oxide coating in accordance with the invention may be deposited as an overcoat layer on a haze-free undercoat tin oxide film made from monophenyltin trichloride. The overcoat may be made using organotin compounds which ordinarily give hazy coatings when deposited directly on glass at elevated glass temperatures. For example, such compounds as tin tetrachloride, monoalkyltin trichlorides, e.g. monobutyltin trichloride, dibutyltin diacetate, dimethyltin dichloride, and the like, may be used. Monobutyltin trichloride is a preferred source organotin compound for the second layer.

In one embodiment of the glass structures of the invention, a glass sheet, typically a glass window pane, is coated on one major surface thereof with an interference masking tin oxide coating formed by chemical vapor deposition of monophenyltin trichloride. This coating is non-conductive, since its function in the structure is only to mask or reduce iridescence without introducing haze over a wide range of desirable process conditions and within a rapid deposition rate. In accordance with the invention, this coating is substantially haze-free, that is, has a percent haze of less than 1%, and, in fact, is about equal to the percent haze for uncoated glass.

A conductive infrared-reflecting tin oxide coating is provided on the opposite surface of the sheet. This coating may be made from any conventional doped tin oxide source, e.g. dibutyltin difluoride, dibutyltin diacetate, monobutyltin trichloride, and a suitable dopant, e.g. fluorine, from such sources as trifluoroacetic acid and ethyl trifluoroacetic acid. A preferred conductive tin oxide layer is made from a liquid coating composition of liquid monobutyltin trichloride and liquid trifluoroacetic acid, suitably in a composition range of about 70–99 wt. % of the monobutyltin trichloride and 1–30 wt. % of the trifluoroacetic acid.

The haze-free, interference masking tin oxide coating or the conductive infrared-reflecting tin oxide may be made up to two layers, a haze-free undercoat layer made from monophenyltin trichloride and an overcoat layer, made from a conventional source of tin oxide. The presence of the haze-free undercoat layer assures that the overcoat layer will be haze-free over a wide range of deposition conditions.

The undercoat tin oxide film suitably has a thickness of at least 10 nm, preferably 30 nm.

The haze-free interference masking tin oxide layer also may be used in a double-glazed window structure enclosing an insulating air space between an inner transparent sheet and an outer transparent sheet. These sheets are formed of glass and the conductive tin oxide coatings are present on the inner surfaces of the glass, facing each other.

In a typical embodiment of the invention, as described in the aforementioned patents, there is a difference of about ¼ wavelength between the conductive and masking coatings, e.g. the conductive coating is about 0.2 microns while the masking coating is about 0.27 microns, the difference being 0.07 microns.

The haze-free characteristic of the tin oxide coating made from monophenyltin trichloride was determined by measurements on the Gardner hazemeter, according to ASTM D1003-61 (Reapproved 1977) Method A.

The film thicknesses were measured by the beta-backscatter method according to British Standards Institution Method BS5411; Part 12, 1981, ISO 3543-1981.

While the invention has been described with particular reference to certain embodiments thereof, it will be understood that changes and modifications may be made which are within the skill of the art. Accordingly, it is intended to be bound only by the appended claims.

What is claimed is:

1. In a transparent, non-iridescent, infrared-reflecting glass window structure comprising a glass sheet, an infrared-reflecting tin oxide coating on one major surface of the sheet, and an iridescence-reducing tin oxide coating on the opposed surface of the sheet, the improvement characterized by:

said iridescence-reducing tin oxide coating being haze-free and made by contacting said sheet at a temperature of about 450° to 650° C. with monophenyltin trichloride vapor in an oxygen-containing atmosphere.

2. A glass window structure according to claim 1 wherein said infrared-reflecting layer comprises an undercoat, haze-free tin oxide layer made from monophenyltin trichloride, and an overcoat infrared-reflecting tin oxide layer, said overcoat layer assuming the haze-free characteristic of the undercoat layer.

3. A double-glazed glass window structure comprising at least two of said transparent, non-iridescent, infrared-reflecting glass window structures according to claim 1 assembled with the surfaces of the infrared-reflecting and the iridescence-reducing tin oxide layers facing each other.

4. A double-glazed glass window structure comprising at least two of said transparent, non-iridescent, infrared-reflecting glass window structures according to claim 2 wherein. Said glazing having a transparent, infrared reflecting layer is on the interior surface thereof, and said iridescent-reducing layer is on the interior surface of the other glazing.

* * * * *